United States Patent
Kawano

(10) Patent No.: US 7,267,725 B2
(45) Date of Patent: Sep. 11, 2007

(54) THIN-FILM DEPOSITION APPARATUS

(75) Inventor: Baiei Kawano, Tama (JP)

(73) Assignee: ASM Japan K.K., Tokyo (JP)

( * ) Notice: Subject to any disclaimer, the term of this patent is extended or adjusted under 35 U.S.C. 154(b) by 343 days.

(21) Appl. No.: 10/841,794

(22) Filed: May 7, 2004

(65) Prior Publication Data

US 2004/0221808 A1 Nov. 11, 2004

(30) Foreign Application Priority Data

May 9, 2003 (JP) ............................. 2003-132221

(51) Int. Cl.
  *C23C 16/00* (2006.01)
  *C23F 1/00* (2006.01)
  *H01L 21/306* (2006.01)
(52) U.S. Cl. ..................... 118/719; 118/729; 118/733; 156/345.31; 156/345.54; 204/298.23; 204/298.25
(58) Field of Classification Search ............... 118/719, 118/729, 733; 156/345.31, 345.54; 204/298.23, 204/298.25
See application file for complete search history.

(56) References Cited

U.S. PATENT DOCUMENTS

| | | | | |
|---|---|---|---|---|
| 4,854,263 A | | 8/1989 | Chang et al. | |
| 5,685,914 A | * | 11/1997 | Hills et al. | 118/723 E |
| 5,730,801 A | * | 3/1998 | Tepman et al. | 118/719 |
| 6,409,837 B1 | * | 6/2002 | Hillman | 118/712 |
| 6,695,318 B2 | * | 2/2004 | Golovato et al. | 277/628 |
| 2001/0035132 A1 | * | 11/2001 | Kent et al. | 118/733 |
| 2002/0036065 A1 | | 3/2002 | Yamagishi et al. | |
| 2003/0097987 A1 | | 5/2003 | Fukuda | |
| 2005/0022737 A1 | * | 2/2005 | Shimizu et al. | 118/715 |

FOREIGN PATENT DOCUMENTS

JP  2002-353207  12/2002
JP  2003-163208  6/2003

* cited by examiner

*Primary Examiner*—Karla Moore
(74) *Attorney, Agent, or Firm*—Knobbe, Martens, Olson & Bear LLP

(57) ABSTRACT

A thin-film deposition apparatus includes a reaction chamber, a substrate transfer chamber, a susceptor having a radially-extending step portion, a ring-shaped separation wall for separating the reaction chamber and the substrate transfer chamber at a processing position where the susceptor is positioned inside the ring-shaped separation wall, and a conductive sealing member which is interposed between the radially-extending step portion and the separation wall to seal the reaction chamber from the substrate transfer chamber when the susceptor is at a processing position.

42 Claims, 4 Drawing Sheets

ND APPARATUS

BACKGROUND OF THE INVENTION

1. Field of the Invention

The present invention relates to a thin-film deposition apparatus which forms a thin film on a semiconductor substrate, and, in particular, to a thin-film deposition apparatus which allows complete separation of a reaction chamber and a substrate transfer chamber.

2. Description of the Related Art

As semiconductor apparatuses have become highly integrated, ALCVD (Atomic Layer Chemical Vapor Deposition) having high thin-film deposition controllability attracts attention and replaces conventionally-used CVD (Chemical Vapor Deposition). Because ALCVD forms a thin film predominantly by absorption of atoms or molecules onto a semiconductor wafer, which is caused using multiple reaction gases to be absorbed onto the semiconductor wafer, thin-film deposition can deposit one atomic or molecular layer at a time and can form a film being several-molecules thick, and the step coverage of a resultant film is excellent.

When an ALCVD process is conducted, evacuating residual gas completely from a reactor before switching to a different reaction gas becomes important. If the residual gas remains inside the reactor, CVD reaction occurs in the vapor phase, making it difficult to control film thickness at the molecular layer level. Additionally, it causes a problem of generation of particles because a particle size generated becomes larger during vapor phase reaction.

To completely evacuate residual gas from within the reactor, conventionally a prolonged purge process was required; as a result, throughput was declined.

As a method for purging residual gas inside the reactor, the following method has been reported. That is, the reaction area and the transfer area are not completely separated and a slight gap (approximately 0.5 mm) is created; feeding an inert gas from the transfer area through the gap prevents process gas from entering into the transfer area (e.g., U.S. Pat. No. 4,854,263; and Japanese Patent Laid-open No. 2002-353207).

This method, however, was not able to completely prevent reaction gas from entering into the transfer area by diffusion; unwanted films deposited by CVD reaction were observed inside the transfer area. This indicates that the transfer area is at risk of particle generation because residual reaction gas cannot be completely evacuated except expediting a maintenance cycle. Additionally, it is difficult to shorten the purge time as well by this method.

Furthermore, in Japanese Patent Application No. 2001-361669, a method for separating a reaction chamber and a substrate transfer area by gas sealing is described. Because more processes use higher-frequency RF power as the wafer diameter has increased in recent years, impedance of a heater itself, which is embedded inside the susceptor, cannot be ignored in such processes. As a result, an electric potential difference between a grounded reactor and a susceptor becomes larger; if the electric potential difference exceeds the ionization potential of a gas used for sealing, plasma discharge is generated between the transfer chamber and the lower portion of the susceptor. In that case, a very small amount of deposition gas diffused from the reaction area causes a decomposition reaction in the plasma; accumulates adhere to a gate valve separating transfer chamber walls or a load-lock chamber and the transfer chamber. These accumulates can exfoliate and cause particle contamination.

SUMMARY OF THE INVENTION

Consequently, an object of the present invention in an embodiment is to provide a thin-film deposition apparatus enabling considerable reduction of the purge time of residual gas by completely separating the reaction area and the transfer area.

Another object of the present invention in an embodiment is to provide a thin-film deposition apparatus in which an electric potential difference between a grounded reactor and a susceptor is not caused.

Still another object of the present invention in an embodiment is to provide a thin-film deposition apparatus achieving high throughput and having a low risk of particle contamination.

The present invention can include any other objects in connection to effective purging, simplicity of the structures, unwanted film formation, efficient film formation, formation of reliable film quality, etc. To achieve the above-mentioned objects, the thin-film deposition apparatus according to an embodiment of the present invention comprises: (i) a reaction chamber provided with a showerhead and an annular exhaust duct having an annular slit; (ii) a substrate transfer chamber disposed underneath the reaction chamber; (iii) a susceptor which is movable between the reaction chamber and the substrate transfer chamber, said susceptor having a radially-extending step portion; (iv) a ring-shaped separation wall for separating the reaction chamber and the substrate transfer chamber at a processing position where the susceptor is positioned inside the ring-shaped separation wall, and an upper surface of the susceptor is substantially aligned with an upper surface of the separation wall in an direction perpendicular to an axial direction of the susceptor, said separation wall and said annular exhaust duct being disposed coaxially with the susceptor, said upper surface of the separation wall constituting a lower part of the annular slit of the annular exhaust duct; and (v) a conductive sealing member which is interposed between the radially-extending step portion and the separation wall to seal the reaction chamber from the substrate transfer chamber when the susceptor is at the processing position.

It is possible to completely separate a reaction chamber area and a substrate transfer chamber area by physically bringing a susceptor, on which a semiconductor wafer is placed, into contact with an internal wall of the reaction chamber. However, it is difficult to parallelize the susceptor with the wall to be brought into contact; hence, complete separation of the reaction chamber and the substrate transfer chamber is not successful. Also, it is possible to separate the areas by providing sealing using an O-ring provided on an upper surface at an outer periphery of the susceptor, which is pressed by a lower surface of a ring-shaped separation plate. However, the O-ring is made of a plastic material and damaged if a temperature rises above 300° C., although no problem occurs when a temperature is relatively low (approximately 200° C.). Further, in the above, the ring-shaped separation plate covers the upper surface at the outer peripheral of the susceptor; that is, an annular protuberance is formed on top of the upper surface of the susceptor along its periphery at a processing position, thereby interfering with exhaust gas flow. In the aforesaid embodiment of the present invention, the above problems are effectively resolved.

The aforesaid embodiment of the apparatus includes, but is not limited to, the following embodiments:

The annular exhaust duct may have a cross section which is a deformed C-shape having an upper portion contacting the showerhead and a lower portion contacting the substrate transfer chamber, wherein the separation wall is constituted by the lower portion of the exhaust duct. The separation wall may comprise a separation plate made of an insulating material which constitutes the lower portion of the slit and is substantially aligned with the upper surface of the susceptor. The separation plate may extend inward from the lower portion of the exhaust duct. The conductive sealing member may be attached to the separation plate. The conductive sealing member may be attached to the step portion of the susceptor. The upper portion of the duct may have an inner periphery, and the lower portion of the duct may have an inner periphery which is substantially aligned with the inner periphery of the upper portion of the duct in the axial direction of the susceptor.

In another embodiment, the annular exhaust duct may have a cross section which is an upside down V-shape having an upper portion contacting the showerhead, and wherein the separation wall is constituted by an upper portion of the substrate transfer chamber. The duct can be formed in any suitable shape. The upper portion of the substrate transfer chamber may comprise a separation plate made of an insulating material which is substantially aligned with the upper surface of the susceptor. The sealing member may be attached to the upper portion of the substrate transfer chamber, said upper portion of the substrate transfer chamber being conductive. The sealing member may be attached to the step portion of the susceptor. The upper portion of the duct may have an inner periphery, and the upper portion of the substrate transfer chamber may have an inner periphery which is substantially aligned with the inner periphery of the upper portion of the duct in an axial direction of the susceptor.

As described above, the separation wall can be configured in various ways. The separation wall can be a part of the exhaust duct and/or a part of the substrate transfer chamber, and can further comprise a separation plate which is a different piece than either of the duct or the substrate transfer chamber but is attached to either. The separation wall may be constituted by an insulating material to prevent unwanted plasma discharge near the outer periphery of the susceptor. As long as the purpose is achieved, the separation wall or the separation plate can be in any shape and have various sizes. The upper surface of the separation wall may be constituted by an insulating material. The insulating material may be ceramics. The separation wall can be conductive, e.g., the separation wall is a part of the substrate transfer chamber and when the susceptor is at the processing position, electric contact is established between the substrate transfer chamber and the susceptor via the sealing member. When electric contact is established between the susceptor and the substrate transfer chamber, the apparatus may further comprise an RF power source which exerts RF energy between the showerhead and the susceptor.

In an embodiment, the sealing member is bellows. The bellows may comprise at least one annular ridge. The bellows may be constituted by aluminum.

In another embodiment, the sealing member is an O-ring covered with a conductive material. The conductive material may have a cross section which is a C-shape and is exposed to a reaction space.

In the present invention, in a preferable embodiment, the apparatus may be an atomic layer CVD (ALCVD) apparatus. In an embodiment, plasma enhanced (PE) ALCVD apparatus. The above features are suitable for ALCVD, but the present invention should not be limited to ALCVD and can be adapted to any suitable CVD.

In another aspect, the present invention provides a thin-film deposition apparatus comprising: (i) a reaction chamber provided with a showerhead and an annular exhaust duct having an annular slit, said exhaust duct comprising an upper portion contacting the showerhead and constituting an upper part of the annular slit; (ii) a substrate transfer chamber disposed underneath the reaction chamber; (iii) a susceptor which is movable between the reaction chamber and the substrate transfer chamber, said susceptor having a radially-extending step portion; (iv) a ring-shaped separation wall for separating the reaction chamber and the substrate transfer chamber at a processing position where the susceptor is positioned inside the ring-shaped separation wall, said separation wall and said annular exhaust duct being disposed coaxially with the susceptor, said separation wall having an upper portion constituting a lower part of the annular slit of the annular exhaust duct, said separation wall having an inner periphery which is substantially aligned with an inner periphery of the upper portion of the exhaust duct in an axial direction of the susceptor; and (v) a conductive sealing member which is interposed between the radially-extending step portion and the separation wall to seal the reaction chamber from the substrate transfer chamber when the susceptor is at the processing position.

In the above embodiment, an upper surface of the separation wall and an upper surface of the susceptor need not be aligned with each other in a direction perpendicular to an axial direction of the susceptor. In an embodiment, the upper surface of the separation wall is lower than the upper surface of the susceptor at the processing position. As long as the annular slit is not closed by the sidewall of the susceptor at the processing position, the alignment is not required. However, in a preferable embodiment, the alignment is adopted for efficient gas purging in a radial direction.

In still another aspect, the present invention provides an apparatus for forming a thin film comprising: (i) a reaction chamber provided with a showerhead and an exhaust duct; (ii) a substrate transfer chamber coaxially connected to the reaction chamber; (iii) a susceptor which is movable between the reaction chamber and the substrate transfer chamber, said susceptor having a radially-extending step portion; (iv) a separation wall for separating the reaction chamber and the substrate transfer chamber when the susceptor is positioned in the reaction chamber; and (v) a conductive sealing member which is attached to either the separation wall or the radially-extending step portion and which is interposed therebetween to seal the reaction chamber from the substrate transfer chamber when the susceptor is positioned in the reaction chamber where the susceptor is in electric contact with the substrate transfer chamber via the conductive sealing member.

In the above embodiment, the exhaust duct need not be annular. The duct may be configured so as to flow gas in one direction, not in a radial direction. In a preferable embodiment, the duct is annular and has an annular slit. Further, in the above embodiment, electric contact between the susceptor and the substrate transfer chamber is established. This configuration is adopted for plasma treatment. That is, when RF energy is applied to a reaction space, a plasma discharge may occur between the susceptor and the substrate transfer chamber. By eliminating an electric potential between the susceptor and the substrate transfer chamber, no unwanted plasma discharge can be inhibited, thereby inhibiting unwanted film formation or a particle generation problem.

In yet another aspect, the present invention provides a thin-film deposition apparatus comprising: (i) a reaction chamber provided with a showerhead and an annular exhaust duct having an annular slit; (ii) a substrate transfer chamber disposed underneath the reaction chamber; (iii) a susceptor which is movable between the reaction chamber and the substrate transfer chamber, said susceptor having a radially-extending step portion; (iv) a ring-shaped separation wall for separating the reaction chamber and the substrate transfer chamber at a processing position where the susceptor is positioned inside the ring-shaped separation wall, and an upper surface of the susceptor is substantially aligned with an upper surface of the separation wall in an direction perpendicular to an axial direction of the susceptor, said separation wall and said annular exhaust duct being disposed coaxially with the susceptor, said upper surface of the separation wall constituting a lower part of the annular slit of the annular exhaust duct; and (v) a sealing member which is interposed between the radially-extending step portion and the separation wall to seal the reaction chamber from the substrate transfer chamber when the susceptor is at the processing position.

In the above embodiment, the sealing member can be constituted by an insulating material such as fluorocarbon material (e.g., Viton™ manufactured by Viton, USA) or perfluorocarbon rubbers (e.g., Dupra™ manufactured by Daikin, Japan, Chemraz™ manufactured by Greene Tweed, USA). In the above embodiment, the upper surface of the separation wall and the upper surface of the susceptor are substantially aligned at the processing position in a direction perpendicular to an axial direction of the susceptor, thereby rendering gas purging more efficient in combination with the annular slit. The lower surface of the slit is the upper surface of the separation wall, and thus, gas can flow very smoothly in a radial direction because there is no obstacle in a flow path. The showerhead emits gas toward a substrate substantially in the axial direction of the susceptor. The gas flows smoothly to the annular slit. The purging of the gas can be accomplished very efficiently.

In further another aspect, the present invention provides a thin-film deposition apparatus comprising: (i) a reaction chamber provided with a showerhead and an annular exhaust duct having an annular slit, said exhaust duct comprising an upper portion contacting the showerhead and constituting an upper part of the annular slit; (ii) a substrate transfer chamber disposed underneath the reaction chamber; (iii) a susceptor which is movable between the reaction chamber and the substrate transfer chamber, said susceptor having a radially-extending step portion; (iv) a ring-shaped separation wall for separating the reaction chamber and the substrate transfer chamber at a processing position where the susceptor is positioned inside the ring-shaped separation wall, said separation wall and said annular exhaust duct being disposed coaxially with the susceptor, said separation wall having an upper portion constituting a lower part of the annular slit of the annular exhaust duct, said separation wall having an inner periphery which is substantially aligned with an inner periphery of the upper portion of the exhaust duct in an axial direction of the susceptor; and (v) a sealing member which is interposed between the radially-extending step portion and the separation wall to seal the reaction chamber from the substrate transfer chamber when the susceptor is at the processing position.

In this embodiment, the inner periphery of the upper portion of the duct and the inner periphery of the separation wall are substantially aligned with each other in the axial direction of the susceptor. That is, the outer periphery of the susceptor is close to the annular slit. The purging can be accomplished efficiently.

The present invention further includes the following embodiments:

That is, in an embodiment, the present invention provides an apparatus for forming a thin film on an object-to-be-processed, comprising: (a) a reaction chamber; (b) a substrate transfer chamber; (c) a susceptor for placing and heating the object-to-be-processed thereon, said susceptor having a step portion extending in a radial direction; (d) an elevating device for raising/lowering the susceptor between the reaction chamber and the substrate transfer chamber; (e) a showerhead disposed facing and parallel to the susceptor inside the reaction chamber, said showerhead having a number of fine pores used for emitting a jet of reaction gas toward the object-to-be-processed; (f) an exhaust duct provided in the vicinity of a lower portion of the showerhead and having a ring shape formed along a sidewall of the reaction chamber, said exhaust duct supporting the showerhead; (g) a circular-ring-shaped separation plate disposed concentrically with the exhaust duct, which is provided in the vicinity of a bottom surface of the exhaust to form a given gap with the bottom surface; and (h) a bellows member attached on a bottom surface of the separation plate or on a surface of the step portion, said bellows member being cylindrical and disposed concentrically with the separation plate and at a tip of which a ring for sealing is provided, wherein sealing is achieved when the surface of the step portion or the bottom surface of the separation plate and the ring for sealing of the bellows member are engaged and the bellows member is pressed as the susceptor ascends to a reaction position inside the reaction chamber by the elevating device to form a thin film on the object-to-be-processed.

In an embodiment, the bellows member may comprise a heat-resistant and corrosion-resistant metal and is joined with the bottom surface of the separation plate by welding or by a metal gasket. The bellows member may be constituted by aluminum. In an embodiment, the apparatus may further comprise a conductive member electrically connecting the bellows member and a sidewall of the substrate transfer chamber.

In another embodiment, An apparatus for forming a thin film on an object-to-be-processed, comprising: (a) a reaction chamber; (b) a substrate transfer chamber; (c) a susceptor for placing and heating the object-to-be-processed thereon, said susceptor having a step portion extending in a radial direction; (d) an elevating device for raising/lowering the susceptor between the reaction chamber and the substrate transfer chamber; (e) a showerhead disposed facing and parallel to the susceptor inside the reaction chamber, said showerhead having a number of fine pores used for emitting a jet of reaction gas toward the object-to-be-processed; (f) an exhaust duct provided in the vicinity of a lower portion of the showerhead and having a ring shape formed along a sidewall of the reaction chamber, said exhaust duct supporting the showerhead; (g) a circular-ring-shaped separation plate disposed concentrically with the exhaust duct device, which is provided in the vicinity of a bottom surface of the exhaust device to form a given gap with the bottom surface; and (h) an O-ring-shaped gasket attached on a bottom surface of the separation plate or on a surface of the step portion, said O-ring-shaped gasket comprising a tubular coil spring which is covered by a metal having a C-shaped cross section, wherein sealing is achieved when the surface of the step portion or the bottom surface of the separation plate and the gasket are engaged and the gasket is pressed when the susceptor ascends to a reaction position inside the reaction chamber by the elevating device to form a thin film on the object-to-be-processed, and wherein sealing is achieved, the susceptor and the substrate transfer chamber are electrically connected.

In an embodiment, the gasket may be attached on the bottom surface of the separation plate so that an exposed portion of the coil spring faces an outer periphery direction, thereby preventing the coil spring from contacting reaction gas. The metallic coating may be constituted by a heat-resistant and corrosion-resistant metal material. The metallic coating may be constituted by aluminum.

In the foregoing embodiments of the present invention, any element used in an embodiment can be interchangeably used in another embodiment as long as it is feasible. No restriction should not be imposed on selecting elements between embodiments. In particular, any of the dependent features described above should be able to be used in any of the independent configurations.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 1(A) shows a position in which a semiconductor substrate is being transferred. FIG. 1(B) shows a position in which deposition reaction takes place.

FIG. 2(B) shows an oblique perspective view of the bellows means 8. FIG. 2(C) shows a modified example of the bellows means.

Explanation of symbols used is as follows: 1: Thin-film deposition apparatus; 2: Reaction chamber; 3: Substrate transfer chamber; 4: Susceptor; 5: Exhaust duct means; 6: Showerhead; 7: Separation plate; 8: Bellows means; 9: Substrate lift pin; 10: Fine pore; 11: Reaction gas inlet port; 12: Elevating means; 13: Semiconductor substrate; 14: Step portion; 15: Reaction space; 16: Gap; 17: Bottom surface.

DETAILED DESCRIPTION OF THE PREFERRED EMBODIMENT

The invention will be explained further with reference to specific embodiments, but the invention should not be limited thereto.

Figure 1A:
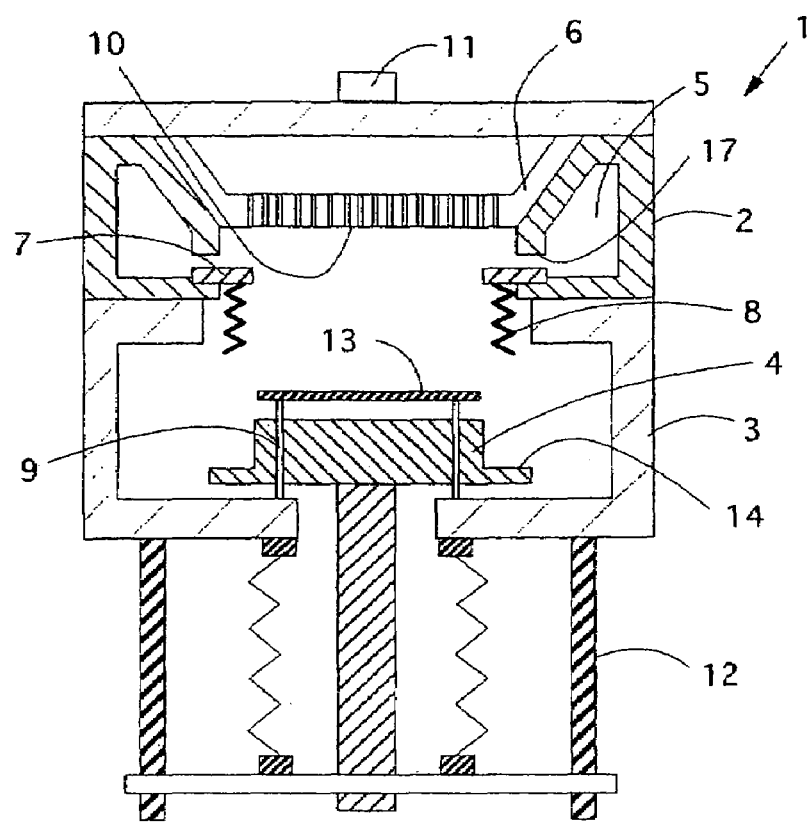
FIGS. 1(A) and 1(B) are cross-sectional schematic views showing a thin-film deposition apparatus according to an embodiment of the present invention.
Figure 1B:
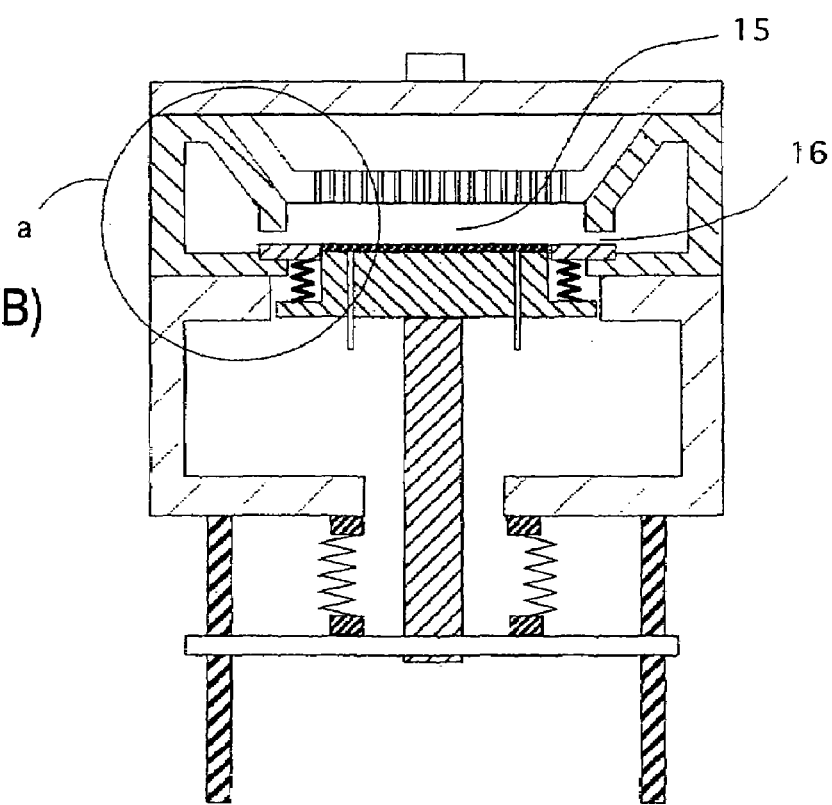

The present invention is described in detail with reference to figures. FIGS. 1(A) and 2(B) show cross-sectional schematic views of a preferred embodiment for carrying out the thin-film deposition apparatus according to the present invention. FIG. 1(A) shows a position, in which a semiconductor substrate is carried into a substrate transfer chamber from a load-lock chamber (not shown). FIG. 1(B) shows a position in which deposition reaction takes place.

A thin-film deposition apparatus 1 according to an embodiment of the present invention comprises the reaction chamber 2 and the substrate transfer chamber 3. Inside the thin-film deposition apparatus 1, a susceptor 4 for placing a semiconductor substrate 13 on it is provided. The susceptor 4 moves up and down between the reaction chamber 2 and the substrate transfer chamber 3 by an elevating means 12. A heating device such as a sheath heater (not shown) is embedded inside the susceptor 4 and heats the semiconductor substrate 13 at a given temperature (e.g., about 50° C. to about 500° C.). The lower portion of the susceptor 4 forms a step portion 14 extending in a radial direction. Three to four substrate lift pins 9 passing through the susceptor 4 lift the susceptor upwards when a substrate is transferred. The susceptor is electrically grounded and functions as one of RF electrodes as well. However, the apparatus need not be provided with RF electrodes, that is, this apparatus can be not only a plasma CVD or an in situ/remote plasma CVD, but also a thermal CVD. When no plasma is used for deposition of a film, switching gases in the reaction chamber very quickly is important to ALCVD, because each atomic layer can be formed from a different gas. Quick purging directly affects the total process time.

The substrate transfer chamber 3 is provided with a gate valve or gate valves (not shown) for carrying a substrate in and out of the chamber 3.

On the ceiling portion of the reaction chamber 2, a showerhead 6 is installed facing and parallel to the susceptor 4. Thousands of fine pores are provided in the showerhead 6; a reaction gas introduced from a reaction gas inlet port 10 is emitted equally to the semiconductor substrate 13 through the fine pores 10. The showerhead 6 is connected to an RF power source (not shown) and functions as the other RF electrode as well. The showerhead 6 is maintained at a given temperature (e.g., about 50° C. to about 500° C.).

When using RF power to generate a plasma, in an embodiment, RF energy is exerted between the susceptor and the showerhead. However, RF energy can be applied to other places, such as between an upper portion of the showerhead and a lower portion of the showerhead. In this case, the susceptor need not function as an electrode. RF power and its frequencies are selected depending on the type of source gas and the type of a target film.

The showerhead is not limited to the one shown in the figures. For example, a showerhead composed of two compartments having a common showerhead surface can be used. At least one of the compartments is connected to an exhaust system different from the exhaust duct provided in the vicinity of the susceptor. Because the exhaust system provided in the showerhead, it is possible to conduct switching gases very quickly. The lower compartment can be provided with an electrode. The configurations disclosed in U.S. patent application Ser. No. 10/824,798, filed on Apr. 15, 2004, titled "Thin-Film Deposition Apparatus" can be used in the present invention, and the disclosure of which is incorporated herein by reference.

In the vicinity of the lower portion of the showerhead 6, a ring-shaped exhaust duct means 5 is set up along the sidewall of the reaction chamber 2. The exhaust duct means 5 supports the showerhead 6 inside the reaction chamber 2 as well as provides a path for discharging processed reaction gas or purge gas out to a vacuum pump (not shown). A surrounding portion of the exhaust duct means 5 comprises an insulating material.

In the vicinity of the bottom surface 17 of the exhaust duct means 5, a circular ring-shaped separation plate 7 set up concentrically with the exhaust duct means is provided. The separation plate 7 comprises an insulating material such as various types of ceramics including aluminum-based ceramics such as Al2O3, and magnesium-based material such as MgO. As described in detail below, a gap 16 is formed between the bottom surface 17 of the exhaust duct means 5 and the top surface of the separation plate 7 at a given interval; gas inside a reaction space 15 flows to the exhaust duct means 5 through this gap 16.

The separation plate 7 is not limited to the one indicated in the figures but can be any suitable separation plate.

Figure 2A:
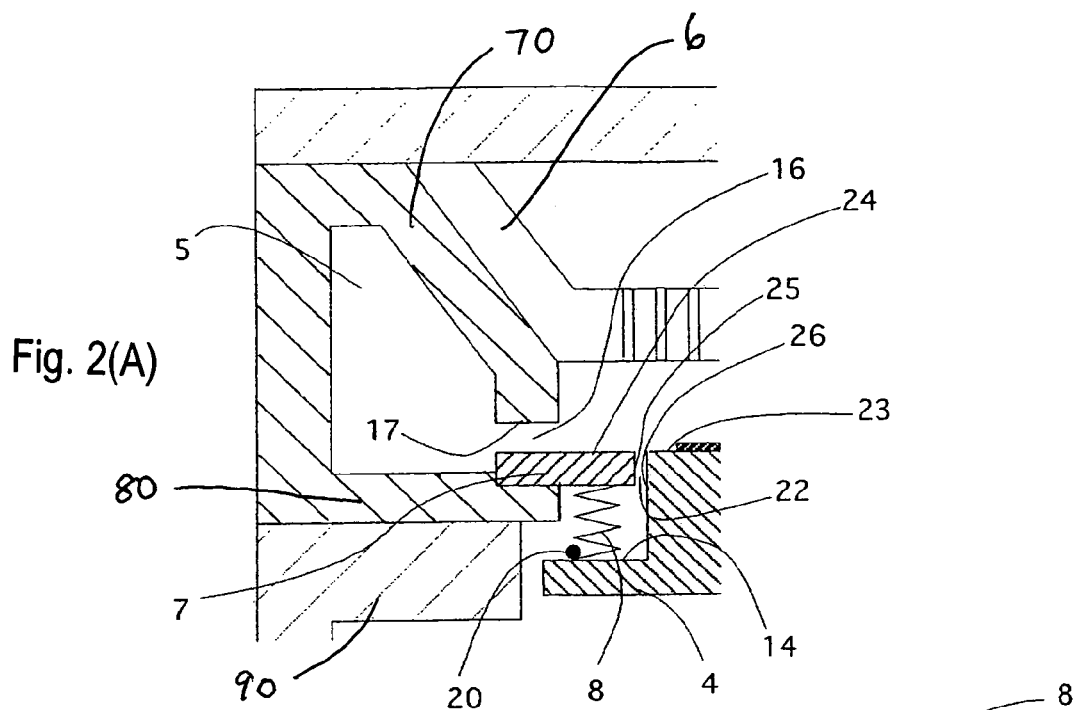
FIGS. 2(A)-2(C) are enlarged views of Part "a" in FIG. 1(B).
Figure 2B:

FIG. 2(A) shows an enlarged view of Part "a" in FIG. 1(B). In this embodiment, a separation wall is comprised of a lower portion of the duct means 80, an upper portion of the substrate transfer chamber 90, and the separation plate 7. The separation wall need not be comprised of such three elements. In an embodiment, the separation wall may be comprised of a lower portion of the duct means and a separation plate without an upper portion of the substrate transfer chamber. In another embodiment, the separation wall may be comprised of an upper portion of the duct means and an upper portion of the substrate transfer chamber without a separation plate. In another embodiment, the separation wall may be comprised of an upper portion of the substrate transfer chamber and a separation plate without a lower portion of the duct means. In any case, preferably, an upper surface of the separation wall may be constituted by an insulating material. Further, the separation plate need not extend inward, as long as the sealing member is interposed between the step portion of the susceptor and a lower surface of the separation wall. The inner periphery of the separation wall can be aligned with the inner periphery of an upper portion of the duct means 70 which supports the showerhead 6.

On the bottom surface of the separation plate 7, a cylindrical bellows means 8 according to an embodiment of the present invention is attached concentrically with the separate plate 7. As shown in FIG. 1(B), when the susceptor 4 is raised to the reaction position to form a thin film on the semiconductor substrate 13, the step portion 14 of the susceptor and the bellows means 8 are engaged, the bellows means is compressed, and sealing is achieved. By this sealing, the reaction chamber 2 and the substrate transfer chamber 3 are completely separated and no reaction gas inside the reaction space 15 makes inroads into the substrate transfer chamber.

The bellows means according to an embodiment of the present invention is described below. FIG. 2(A) shows an enlarged view of Part "a" in FIG. 1(B); FIG. 2(B) shows an oblique perspective view of the bellows means 8. When the susceptor 4 is in the reaction position, the top surface 24 of the separation plate 7 and the top surface 23 of the susceptor 4 are aligned. A gap 22 is formed between a side surface 25 of the separation plate 7 and a side surface 26 of the susceptor 4. A preferable distance for the gap 16 and the gap 22 is each about 0.2 mm to about 4 mm, but can be selected freely (for example, in the range of 0.1 mm to 10 mm, including 0.5 mm, 1.0 mm, 2.0 mm, 3.0 mm, 5.0 mm, and ranges of any two numbers of the foregoing) by changing a thickness (for changing the gap 16) and a width (for changing the gap 22) of the separation plate 7. The gap 16 and the gap 22 can be the same or different, although the gap 16 is preferably larger than the gap 22. On the bottom surface 21 of the separation plate 7, an upper end of the bellows means 8 is attached by welding or by a metal gasket. The bellows means 8 comprises a heat-resistant and corrosion-resistant metal, which endures a high temperature above 300° C. and does not react to reaction gas and its radicals. A typical material of this kind is aluminum. Also, titanium, a nickel-based alloy such as inconel, pure nickel, or the like can be used for the bellows means 8. At a lower end of the bellows means 8, a ring for sealing 20 is attached. A cross section of the ring for sealing 20 is preferably circular; it can be elliptic, triangular, diamond-shaped, etc. as well. Additionally, a groove having a shape corresponding to a cross-sectional shape of the ring for sealing can be formed in an engaging surface of the step portion 14 of the susceptor 4, which is engaged with the ring for sealing 20. With the ring for sealing 20 line-contacting (or surface-contacting) the step portion 14, sealing is achieved and gas passing through the gap 22 is completely shut off.

The ring for sealing 20 may be omitted as long as the seal between the lower end of the bellows means 28 and the step portion 14 is secured when the susceptor is at the upper position. That is, the bellows means 28 urges the lower end toward the step portion 14, and thus, as long as the edge shape of the lower end is configured to be gas-tightly fitted to a surface of the step portion 14, the ring for sealing 20 need not be used.

As a modified example, the ring for sealing 20 can be attached at the upper end of the bellows means 8, and the lower end of the bellows means 8 can be attached on the step portion 14 of the susceptor 4 by welding or by gasket. At this time, when the susceptor 4 is raised to the reaction position, sealing is achieved with the ring for sealing 20 being engaged with the bottom surface 21 of the separation plate 7.

The bellows means is not limited to the one indicated in the figures but can be any sealing member interposed between the separation plate and the susceptor. The sealing member may be constituted by a material having thermal resistance and being non-reactive with radical species or reaction gas such as aluminum, titanium, a nickel-based alloy such as inconel, pure nickel, or the like. The shape should not be limited to bellows but includes any suitable shapes such as those having a C-shape cross section.

Figure 2C:
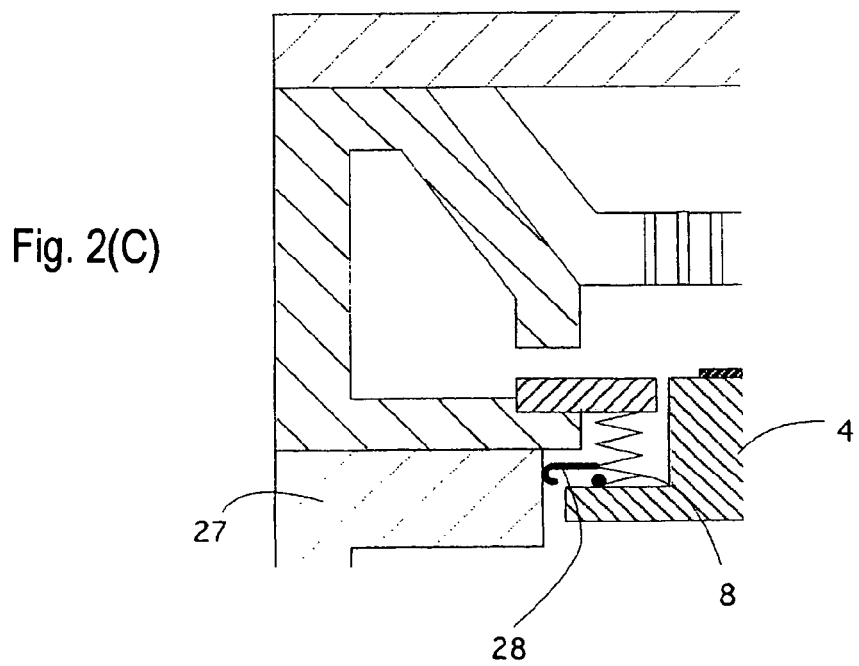

FIG. 2(C) shows a modified example of the bellows means according to an embodiment of the present invention. On a side surface of the bellows means 8, a nearly U-shaped conductive member 28 extending horizontally is attached. A tip of the conductive member 28 contacts the sidewall 27 of the substrate transfer chamber. Because the sidewall 27 has conductivity, the susceptor 4 and the sidewall 27 become electrically conducted; by this, an electric potential difference between the reactor and the susceptor is eliminated. Consequently, undesired plasma generation inside the transfer chamber caused by the impedance of the heater inside the susceptor is suppressed. One or more conductive members 28 can be attached around a circumference of the bellows means 8 and all kinds of shapes can be used in addition to a nearly U-shape.

In another embodiment, the bellows means can be configured to contact an inner surface of the substrate transfer chamber when the bellows means is pressed. For example, when the bellows means is stretched, the outer diameter of the bellows means is small, whereas when the bellows means is pressed, the outer diameter of the bellows means becomes larger. By using this difference in outer diameter, the bellows means can contact the inner surface of the substrate transfer chamber when the susceptor is at the upper position. In this case, there is no additional element required to electrically connect the bellows means and the substrate transfer chamber.

In another embodiment, the separation plate 7 can be integrated with a lower portion of the duct means 5, wherein the lower portion of the duct means extends toward the susceptor to provide a gap 22. The duct means is also constituted by an insulating material. In this case, the lower portion of the duct means is designated as the separation plate or separate partition.

Figure 3A:
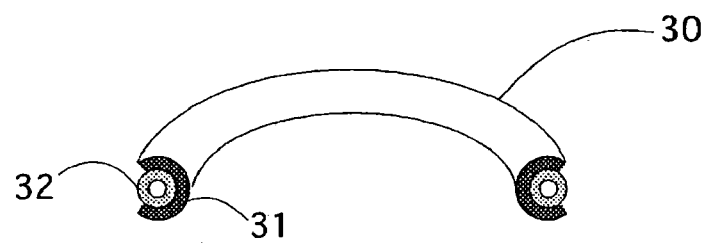
FIG. 3(A) shows a cross section of another sealing means according to the present invention.
Figure 3B:
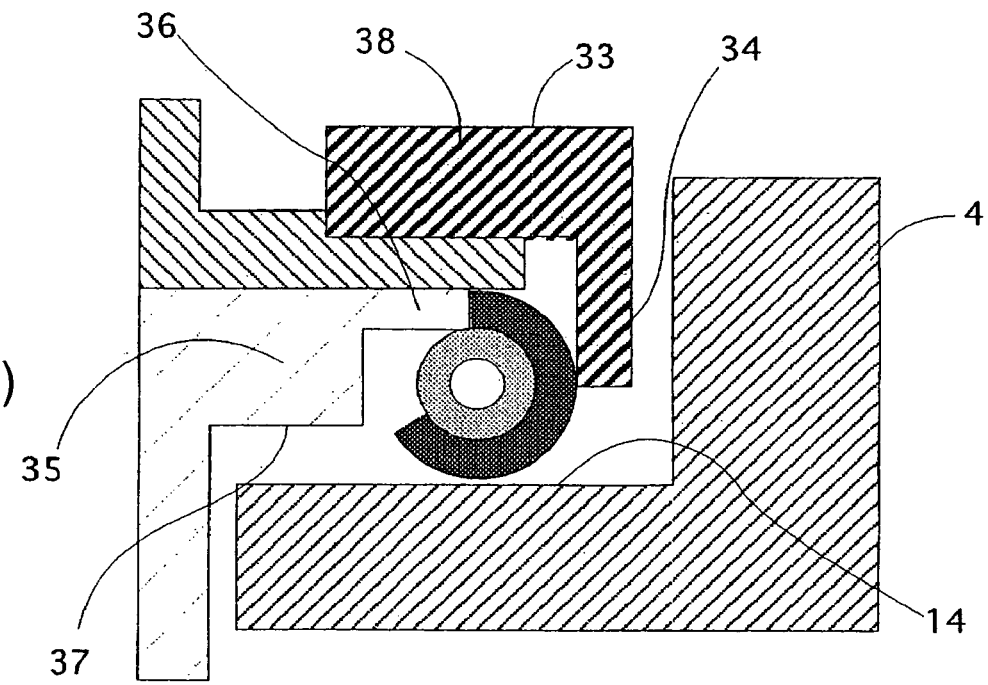
FIG. 3(B) shows a position in which the sealing means is attached.
Figure 3C:
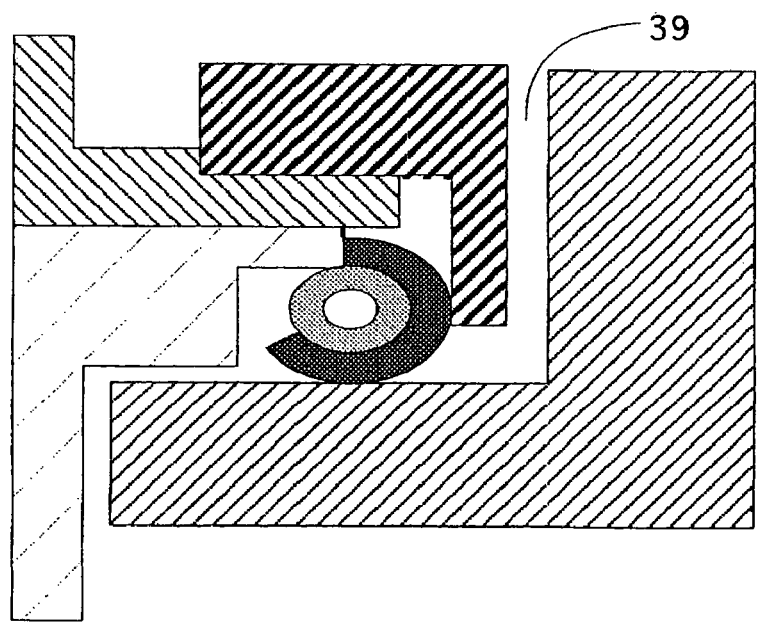
FIG. 3 (C) shows a sealed position by the sealing means.

FIG. 3 shows another embodiment of the sealing means according to an embodiment of the present invention. FIG. 3(A) shows a cross section of an O-ring gasket 30, which is another sealing means according to an embodiment of the present invention. The O-ring gasket 30 comprises a tubular coil spring 32 and aluminum coating 31 having a C-shaped cross-section. FIG. 3(B) shows a position in which the O-ring gasket 30 is attached inside the reactor. In this embodiment, the separation plate 38 comprises a horizontal portion 33 and a lateral portion 34, which extends perpendicularly downward from a tip of the horizontal portion 33. The sidewall of the transfer chamber has a protruding portion 35, which extends inwardly. A thickness of the protruding portion 35 is slightly thinner than a cross-sectional diameter of the O-ring gasket; a thickness is adjusted so that the step portion 14 of the susceptor and the bottom surface 37 of the protruding portion 35 come extremely close to each other when they are in a sealed position as shown in FIG. 3(C). Furthermore, a protruding portion 36 extends toward a horizontal-direction inner side from the top surface of the protruding portion 35 of the transfer chamber sidewall. The protruding portion 36 has a thickness nearly equal to that of the aluminum coating 31 of the O-ring gasket 30 (e.g., 0.5 mm to 5 mm, preferably 0.8 mm to 2 mm, including about 1 mm). The O-ring gasket 30 is inserted between the protruding portion 35 of the transfer chamber sidewall and the lateral portion 34 of the separation plate 38 with the exposed side of the coil spring 32 facing the outside (i.e., the side coated by aluminum is exposed to reaction gas). At this time, the tip of the protruding portion 36 is engaged with the aluminum coating 31, and both become electrically conducted.

In another embodiment, the O-ring gasket 30 is not in contact with an inner surface of the substrate transfer chamber when the susceptor is at the lower position. When the susceptor is at the upper position, the O-ring gasket 30 is deformed and the width in a horizontal direction becomes larger. By using this deformation, the O-ring gasket can contact the inner surface of the substrate transfer chamber when the susceptor is at the upper position. In this case, there is no protruding portion 36 required to electrically connect the O-ring gasket and the substrate transfer chamber.

As shown in FIG. 3(C), when the susceptor 4 is raised to the reaction position, the O-ring gasket 30 is engaged with the step portion 14 of the susceptor 4; sealing is achieved. A surface of the separation plate 38 and a surface of the susceptor 4 are aligned; a gap 39 is formed between the lateral portion 34 of the separation plate 38 and a side surface of the susceptor 4. A preferable distance for this gap 39 is about 0.2 mm to about 4 mm, but can be adjusted (for example, in the range of 0.1 mm to 10 mm, including 0.5 mm, 1.0 mm, 2.0 mm, 3.0 mm, 5.0 mm, and ranges of any two numbers of the foregoing) by changing a width of the horizontal portion 33 or a width of the lateral portion 34 of the separation plate 38. A gas passing through the gap 39 is completely shut off by the O-ring gasket 30; penetration of the gas into the transfer chamber is prevented. Additionally, with the step portion 14 of the susceptor 4 and the aluminum coating 31 being engaged, the susceptor 4, the aluminum coating 31 and the transfer chamber sidewall become electrically conducted, eliminating an electric potential difference between the susceptor 4 and the transfer chamber sidewall. Consequently, undesired plasma generation inside the transfer chamber caused by the impedance of the heater inside the susceptor 4 is suppressed.

As a modified example, the lower end of the O-ring gasket 30 can be attached on the step portion 14 of the susceptor 4 by welding or by a metal gasket. At this time, the upper end of the O-ring gasket 30 is engaged with the bottom surface of the separation plate 38 when the susceptor 4 is raised to the reaction position; sealing is achieved.

As a coating material for the O-ring gasket 30, in addition to aluminum, a heat-resistant and corrosion-resistant metal material such as titanium, a nickel-based alloy such as inconel, pure nickel, or the like can also be used.

Figure 4:
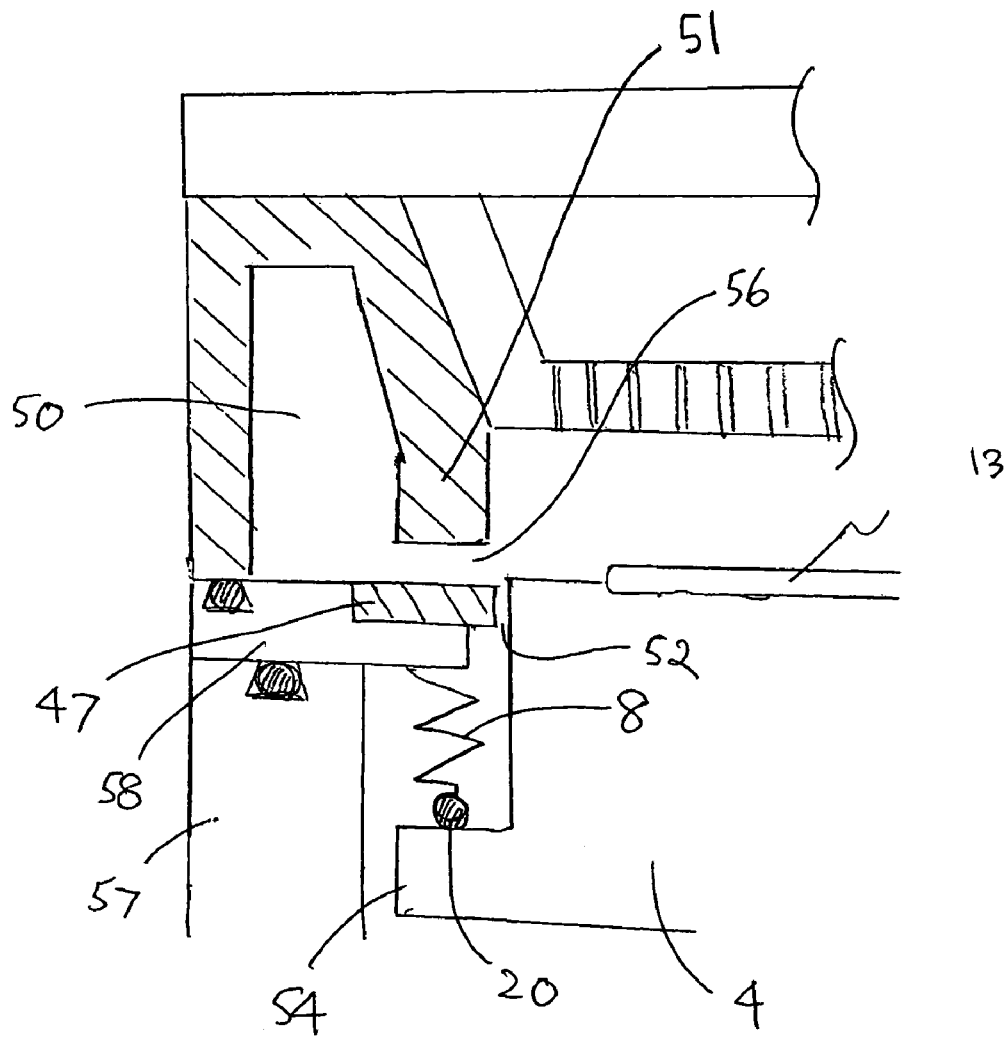
FIG. 4 is an enlarged view showing a structure including a duct, a separation plate, a susceptor, bellows, and a substrate transfer chamber according to an embodiment of the present invention.

FIG. 4 is an enlarged view showing another embodiment of the structure including a duct 50, a separation plate 47, a susceptor 4, bellows 8, and a substrate transfer chamber 57, 58 according to the present invention. In this embodiment, the separation wall is comprised of the upper portion of the substrate transfer chamber 58 and the separation plate 47 without a lower portion of the duct 50. The duct 50 has a different structure than the duct means 5. That is, the duct has an upside down V-shape, instead of the C-shape of the duct means 5. The duct 50 is attached to an upper part of the substrate transfer chamber 57, 58. The portion 58 and the portion 57 are different portions in this embodiment. However, they can be integrated by forming them in a one piece. The separation plate 47 is attached to the upper portion 58 on the side facing the susceptor 4. The duct 50 and the separation plate 47 are constituted by an insulating material so that when plasma energy is applied in a reaction space, no plasma is generated. Thus, the separation plate 47 may have a length sufficient to prevent a plasma discharge. For example, the internal diameter of the separation plate 47 may be in the range of about 310 mm to about 400 mm, preferably about 310 mm to about 350 mm for a 300 mm wafer, or in the range of about 210 mm to about 300 mm, preferably about 210 mm to about 240 mm for a 200 mm wafer. The thickness of the separation plate 47 may be in the range of about 5 mm to about 50 mm, preferably about 5 mm to about 20 mm. These measurements can be applied to a separation plate which can be used in other embodiments.

If the top surface of the susceptor 4 ascends beyond the upper surface of the separation plate 47 when the susceptor is at the processing position, the length of the separation plate 47 need not be long (in an embodiment, no insulating separation plate is required, and the conductive upper portion can function as a separation plate). Gaps 56 and 52 may be similar to the gaps 16 and 22, respectively. In this embodiment, when the susceptor 4 is at the processing position, a step portion 54 of the susceptor 4 is electric contact with the bellows 8 and a seal 20. Because the upper end of the bellows 8 is attached to a lower surface of the upper portion 58, the susceptor becomes automatically in electric contact with the substrate transfer chamber 57 without any additional structure. In another embodiment, the bellows can be installed to the step portion 54, instead of the upper portion 58. Further, the separation plate 47 need not be projected more than the upper portion 58 with respect to the side wall of the susceptor 4.

The present invention exhibits significant advantages including the following:

The thin-film deposition apparatus according to an embodiment of the present invention allows complete separation of the reaction area and the transfer area; consequently, shortening the purge time of residual gas has become possible.

Additionally, the thin-film deposition apparatus according to an embodiment of the present invention eliminates an electric potential difference between the reactor and the susceptor; consequently, undesired plasma generation inside the transfer chamber is prevented.

Furthermore, the thin-film deposition apparatus according to an embodiment of the present invention improves throughput with a shortened purge time; as particle contamination is reduced, manufacturing semiconductor devices with high reliability has become possible.

The present invention claims priority to Japanese Patent Application No. 2003-132221, filed on May 9, 2003, the disclosure of which is incorporated herein by reference.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A thin-film deposition apparatus comprising:
a reaction chamber provided with a showerhead and an annular exhaust duct having an annular slit;
a substrate transfer chamber disposed underneath the reaction chamber;
a susceptor which is movable between the reaction chamber and the substrate transfer chamber, said susceptor having a radially-extending step portion;
a ring-shaped separation wall for separating the reaction chamber and the substrate transfer chamber at a processing position where the susceptor is positioned inside the ring-shaped separation wall, and an upper surface of the susceptor is substantially aligned with an upper surface of the separation wall in an direction perpendicular to an axial direction of the susceptor, said separation wall and said annular exhaust duct being disposed coaxially with the susceptor, said upper surface of the separation wall constituting a lower part of the annular slit of the annular exhaust duct; and
a conductive sealing member which is interposed between the radially-extending step portion and the separation wall to seal the reaction chamber from the substrate transfer chamber when the susceptor is at the processing position.

2. The apparatus according to claim 1, wherein the annular exhaust duct has a cross section which is a deformed C-shape having an upper portion contacting the showerhead and a lower portion contacting the substrate transfer chamber.

3. The apparatus according to claim 2, wherein the separation wall is constituted by the lower portion of the exhaust duct.

4. The apparatus according to claim 3, wherein the separation wall comprises a separation plate made of an insulating material which constitutes the lower portion of the slit and is substantially aligned with the upper surface of the susceptor.

5. The apparatus according to claim 3, wherein the separation plate extends inward from the lower portion of the exhaust duct.

6. The apparatus according to claim 5, wherein the conductive sealing member is attached to the separation plate.

7. The apparatus according to claim 5, wherein the conductive sealing member is attached to the step portion of the susceptor.

8. The apparatus according to claim 2, wherein the upper portion of the duct has an inner periphery, and the lower portion of the duct has an inner periphery which is substantially aligned with the inner periphery of the upper portion of the duct in the axial direction of the susceptor.

9. The apparatus according to claim 1, wherein the annular exhaust duct has a cross section which is an upside down V-shape having an upper portion contacting the showerhead, and wherein the separation wall is constituted by an upper portion of the substrate transfer chamber.

10. The apparatus according to claim 9, wherein the upper portion of the substrate transfer chamber comprises a separation plate made of an insulating material which is substantially aligned with the upper surface of the susceptor.

11. The apparatus according to claim 10, wherein the sealing member is attached to the upper portion of the substrate transfer chamber, said upper portion of the substrate transfer chamber being conductive.

12. The apparatus according to claim 10, wherein the sealing member is attached to the step portion of the susceptor.

13. The apparatus according to claim 9, wherein the upper portion of the duct has an inner periphery, and the upper portion of the substrate transfer chamber has an inner periphery which is substantially aligned with the inner periphery of the upper portion of the duct in an axial direction of the susceptor.

14. The apparatus according to claim 1, wherein the sealing member is bellows.

15. The apparatus according to claim 14, wherein the bellows comprise at least one annular ridge.

16. The apparatus according to claim 14, wherein the bellows are constituted by aluminum.

17. The apparatus according to claim 1, wherein the sealing member is an O-ring covered with a conductive material.

18. The apparatus according to claim 17, wherein the conductive material has a cross section which is a C-shape and is exposed to a reaction space.

19. The apparatus according to claim 1, wherein the upper surface of the separation wall is constituted by an insulation material.

20. The apparatus according to claim 19, wherein the insulating material is ceramics.

21. The apparatus according to claim 1, wherein the separation wall is conductive and when the susceptor is at the processing position, electric contact is established between the substrate transfer chamber and the susceptor via the sealing member.

22. The apparatus according to claim 21, further comprising an RF power source which exerts RF energy between the showerhead and the susceptor.

23. The apparatus according to claim 1, which is an atomic layer CVD apparatus.

24. A thin-film deposition apparatus comprising:
a reaction chamber provided with a showerhead and an annular exhaust duct having an annular slit, said exhaust duct comprising an upper portion contacting the showerhead and constituting an upper part of the annular slit;
a substrate transfer chamber disposed underneath the reaction chamber;
a susceptor which is movable between the reaction chamber and the substrate transfer chamber, said susceptor having a radially-extending step portion;
a ring-shaped separation wall for separating the reaction chamber and the substrate transfer chamber at a processing position where the susceptor is positioned inside the ring-shaped separation wall, said separation wall and said annular exhaust duct being disposed coaxially with the susceptor, said separation wall having an upper portion constituting a lower part of the annular slit of the annular exhaust duct, said separation wall having an inner periphery which is substantially aligned with an inner periphery of the upper portion of the exhaust duct in an axial direction of the susceptor; and
a conductive sealing member which is interposed between the radially-extending step portion and the separation wall to seal the reaction chamber from the substrate transfer chamber when the susceptor is at the processing position.

25. The apparatus according to claim 24, wherein an upper surface of the separation wall is substantially aligned with an upper surface of the susceptor in an direction perpendicular to the axial direction of the susceptor.

26. The apparatus according to claim 24, wherein the separation wall is constituted by a part of the exhaust duct.

27. The apparatus according to claim 26, wherein the separation wall comprises an insulating separation plate constituting the lower part of the slit.

28. The apparatus according to claim 24, wherein the separation wall is constituted by a part of the substrate transfer chamber.

29. The apparatus according to claim 28, wherein the separation wall comprises an insulating separation plate constituting the lower part of the slit.

30. An apparatus for forming a thin film comprising:
a reaction chamber provided with a showerhead and an exhaust duct;
a substrate transfer chamber coaxially connected to the reaction chamber;
a susceptor which is movable between the reaction chamber and the substrate transfer chamber, said susceptor having a radially-extending step portion;
a separation wall for separating the reaction chamber and the substrate transfer chamber when the susceptor is positioned in the reaction chamber; and
an elastic conductive sealing member which is attached to either the separation wall or the radially-extending step portion and which is interposed therebetween to seal the reaction chamber from the substrate transfer chamber when the susceptor is positioned in the reaction chamber where the susceptor is in electric contact with the substrate transfer chamber via the conductive sealing member,
wherein the exhaust duct has an annular exhaust slit provided surrounding the susceptor when the susceptor is positioned in the reaction chamber.

31. The apparatus according to claim 30, wherein the slit is defined by an upper annular surface and a lower annular surface, said lower annular surface being an upper surface of the separation wall.

32. The apparatus according to claim 30, wherein the annular exhaust duct has a cross section which is a deformed C-shape having an upper portion contacting the showerhead and a lower portion contacting the substrate transfer chamber and constituting the separation wall.

33. The apparatus according to claim 32, wherein the lower portion of the exhaust duct comprises an insulating separation plate which constitutes an upper surface of the separation wall.

34. The apparatus according to claim 30, wherein the annular exhaust duct has a cross section which is an upside down V-shape having an upper portion contacting the showerhead, and wherein the separation wall is constituted by an upper portion of the substrate transfer chamber.

35. The apparatus according to claim 34, wherein the upper portion of the substrate transfer chamber comprises an insulating separation plate which constitutes an upper surface of the separation wall.

36. A thin-film deposition apparatus comprising:
a reaction chamber provided with a showerhead and an annular exhaust duct having an annular slit;
a substrate transfer chamber disposed underneath the reaction chamber;
a susceptor which is movable between the reaction chamber and the substrate transfer chamber, said susceptor having a radially-extending step portion;
a ring-shaped separation wall for separating the reaction chamber and the substrate transfer chamber at a processing position where the susceptor is positioned inside the ring-shaped separation wall, and an upper surface of the susceptor is substantially aligned with an upper surface of the separation wall in an direction perpendicular to an axial direction of the susceptor, said separation wall and said annular exhaust duct being disposed coaxially with the susceptor, said upper surface of the separation wall constituting a lower part of the annular slit of the annular exhaust duct; and
a sealing member which is interposed between the radially-extending step portion and the separation wall to seal the reaction chamber from the substrate transfer chamber when the susceptor is at the processing position.

37. A thin-film deposition apparatus comprising:
a reaction chamber provided with a showerhead and an annular exhaust duct having an annular slit, said exhaust duct comprising an upper portion contacting the showerhead and constituting an upper part of the annular slit;
a substrate transfer chamber disposed underneath the reaction chamber;
a susceptor which is movable between the reaction chamber and the substrate transfer chamber, said susceptor having a radially-extending step portion;
a ring-shaped separation wall for separating the reaction chamber and the substrate transfer chamber at a processing position where the susceptor is positioned inside the ring-shaped separation wall, said separation wall and said annular exhaust duct being disposed coaxially with the susceptor, said separation wall having an upper portion constituting a lower part of the annular slit of the annular exhaust duct, said separation wall having an inner periphery which is substantially aligned with an inner periphery of the upper portion of the exhaust duct in an axial direction of the susceptor; and a sealing member which is interposed between the radially-extending step portion and the separation wall to seal the reaction chamber from the substrate transfer chamber when the susceptor is at the processing position.

38. An apparatus for forming a thin film on an object-to-be-processed, comprising:

a reaction chamber;

a substrate transfer chamber;

a susceptor for placing and heating the object-to-be-processed thereon, said susceptor having a step portion extending in a radial direction;

an elevating device for raising/lowering the susceptor between the reaction chamber and the substrate transfer chamber;

a showerhead disposed facing and parallel to the susceptor inside the reaction chamber, said showerhead having a number of fine pores used for emitting a jet of reaction gas toward the object-to-be-processed;

an exhaust duct provided in the vicinity of a lower portion of the showerhead and having a ring shape formed along a sidewall of the reaction chamber, said exhaust duct supporting the showerhead;

a circular-ring-shaped separation plate disposed concentrically with the exhaust duct, which is provided in the vicinity of a bottom surface of the exhaust duct to form a given gap with the bottom surface; and an O-ring-shaped gasket attached on a bottom surface of the separation plate or on a surface of the step portion, said O-ring-shaped gasket comprising a tubular coil spring which is covered by a metal having a C-shaped cross section, wherein sealing is achieved when the surface of the step portion or the bottom surface of the separation plate and the gasket are engaged and the gasket is pressed when the susceptor ascends to a reaction position inside the reaction chamber by the elevating device to form a thin film on the object-to-be-processed, and wherein sealing is achieved, the susceptor and the substrate transfer chamber are electrically connected.

39. The apparatus according to claim 38, wherein the gasket is attached on the bottom surface of the separation plate so that an exposed portion of the coil spring faces an outer periphery direction, thereby preventing the coil spring from contacting reaction gas.

40. The apparatus according to claim 38, wherein the metallic coating is constituted by a heat-resistant and corrosion-resistant metal material.

41. The apparatus according to claim 40, wherein the metallic coating is constituted by aluminum.

42. An apparatus for forming a thin film comprising:

a reaction chamber provided with a showerhead and an exhaust duct;

a substrate transfer chamber coaxially connected to the reaction chamber;

a susceptor which is movable between the reaction chamber and the substrate transfer chamber, said susceptor having a radially-extending step portion;

a separation wall for separating the reaction chamber and the substrate transfer chamber when the susceptor is positioned in the reaction chamber; and an elastic conductive sealing member which is attached to either the separation wall or the radially-extending step portion and which is interposed therebetween to seal the reaction chamber from the substrate transfer chamber when the susceptor is positioned in the reaction chamber where the susceptor is in electric contact with the substrate transfer chamber via the conductive sealing member, wherein the elastic conductive sealing member comprises a coil spring coated with aluminum.

* * * * *